United States Patent
Yang et al.

(10) Patent No.: US 10,306,204 B2
(45) Date of Patent: May 28, 2019

(54) 3D DISPLAY PANEL USING AN ADJUSTABLE BUFFER ZONE, METHOD FOR 3D DISPLAY ON A 3D DISPLAY PANEL USING AN ADJUSTABLE BUFFER ZONE, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Ming Yang, Beijing (CN); Xue Dong, Beijing (CN); Wenqing Zhao, Beijing (CN); Xiaochuan Chen, Beijing (CN); Renwei Guo, Beijing (CN); Pengcheng Lu, Beijing (CN); Changfeng Li, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/113,662

(22) PCT Filed: Dec. 30, 2015

(86) PCT No.: PCT/CN2015/099840
§ 371 (c)(1),
(2) Date: Jul. 22, 2016

(87) PCT Pub. No.: WO2017/024742
PCT Pub. Date: Feb. 16, 2017

(65) Prior Publication Data
US 2018/0146184 A1    May 24, 2018

(30) Foreign Application Priority Data

Aug. 12, 2015    (CN) .......................... 2015 1 0494590

(51) Int. Cl.
*H04N 13/15*    (2018.01)
*G02B 27/22*    (2018.01)
*H01L 27/32*    (2006.01)

(52) U.S. Cl.
CPC ............ *H04N 13/15* (2018.05); *G02B 27/22* (2013.01); *H01L 27/3211* (2013.01)

(58) Field of Classification Search
CPC .. H04N 13/0037; H01L 27/3211; G02B 27/22
See application file for complete search history.

(56) References Cited

U.S. PATENT DOCUMENTS 7,511,716 B2    3/2009  Berestov et al.
2006/0114561 A1*  6/2006  Mashitani .............. H04N 13/31
                                                                359/464

(Continued)

FOREIGN PATENT DOCUMENTS

CN    103048717 A    4/2013
CN    103314596 A    9/2013

(Continued)

OTHER PUBLICATIONS

China Office Action for Application No. 201510494590.2, dated Jan. 3, 2017, 18 pps.

(Continued)

*Primary Examiner* — Ryan A Lubit
(74) *Attorney, Agent, or Firm* — Armstrong Teasdale LLP (57) ABSTRACT

The present disclosure relates to a 3D display panel, including a lower substrate comprising a plurality columns of subpixels in which preset columns of subpixels serve as a buffer zone; a grating configured to allow images of one part of subpixels in the lower substrate to enter a left eye of a (Continued)

viewer, and allow images of the other part of subpixels in the lower substrate to enter a right eye of the viewer; a positioning unit configured to determine a first distance which the viewer moves, and determine whether any subpixel of non-buffer zone is shielded by the grating according to the first distance; and an adjusting unit configured to adjust the buffer zone when the any subpixel of non-buffer zone is shielded by the grating.

15 Claims, 6 Drawing Sheets

(56) References Cited

U.S. PATENT DOCUMENTS

| | | | |
|---|---|---|---|
| 2009/0072120 A1 | 3/2009 | McGarry et al. | |
| 2012/0120203 A1 | 5/2012 | Chen et al. | |
| 2013/0286168 A1 | 10/2013 | Park et al. | |
| 2013/0335385 A1* | 12/2013 | Kim | H04N 13/31 345/204 |
| 2014/0071253 A1 | 3/2014 | de la Barre et al. | |

FOREIGN PATENT DOCUMENTS

| | | |
|---|---|---|
| CN | 104597609 A | 5/2015 |
| CN | 104614863 A | 5/2015 |
| CN | 104795012 A | 7/2015 |

OTHER PUBLICATIONS

Written Opinion for PCT/CN2015/099840, dated Apr. 27, 2016, 10 pps.
Chinese language International Search Report and Written Opinion, dated Apr. 27, 2016, for PCT/CN2015/099840.
European Extended Search Report, Application No. 15892059.5, dated Mar. 26, 2019, 8 pps.

* cited by examiner

3D DISPLAY PANEL USING AN ADJUSTABLE BUFFER ZONE, METHOD FOR 3D DISPLAY ON A 3D DISPLAY PANEL USING AN ADJUSTABLE BUFFER ZONE, AND DISPLAY DEVICE

CROSS-REFERENCE TO RELATED APPLICATIONS

This application is a National Stage Entry of PCT/CN2015/099840, filed Dec. 30, 2015, which claims the benefit and priority of Chinese Patent Application No. 201510494590.2, filed on Aug. 12, 2015, the entire content of each of which is incorporated herein by reference.

BACKGROUND

The embodiments of the present disclosure relate to the field of display techniques, and particularly, to a three-dimensional (3D) display panel, a display device and a 3D display method.

In the existing 3D display technique, generally a buffer zone is provided among the pixels to fit the user's movement, so as to improve the comfort level of 3D watching.

Figure 1:
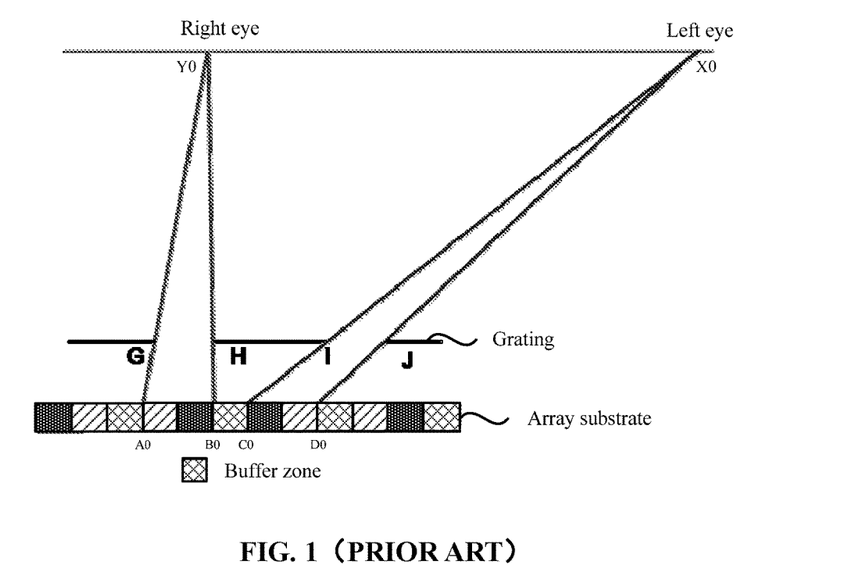
FIG. 1 illustrates a schematic diagram of a 3D display panel in the prior art.
Figure 2:
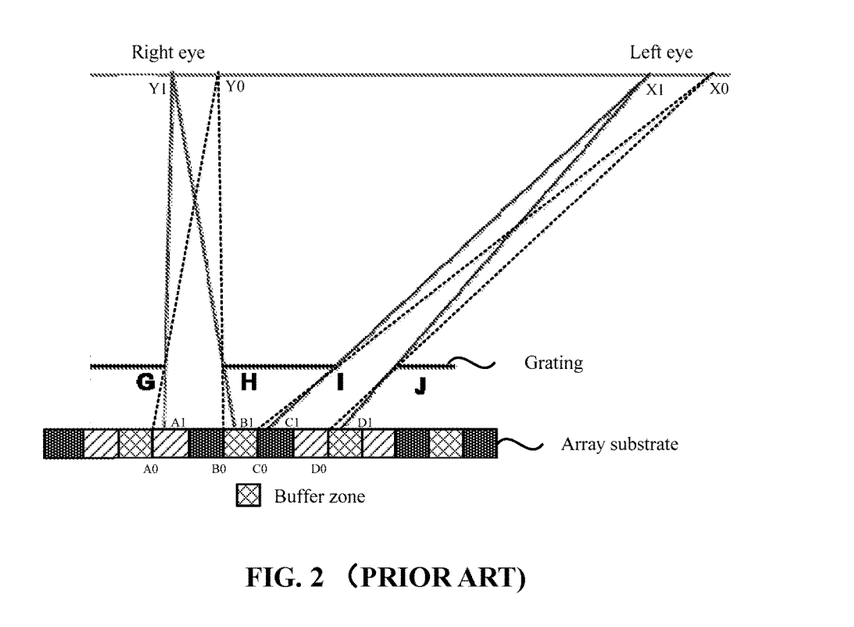
FIG. 2 illustrates another schematic diagram of the prior art 3D display panel shown in FIG. 1.

However, the buffer zone in the prior art is usually set in an OFF state. As shown in FIG. 1, when the user is at the initial position, the right eye is at Y0 and can see the subpixels between A0 and B0, and the left eye is at X0 and can see the subpixels between C0 and D0. Under the condition that the buffer zone is OFF, when the user moves to a particular angle (or position), as shown in FIG. 2, the right eye is at Y1 and can see the subpixels between A1 and B1, and the left eye is at X1 and can see the subpixels between C1 and D1, thus the buffer zone between B0 and C0 is seen, while the subpixels between A0 and A1 and the subpixels between C0 and C1 are partially shielded by the grating. Since the buffer zone in the OFF state does not emit light, the brightness of the image viewed by the user is decreased. In addition, since the aperture of the grating is fixed, when the user sees the buffer zone not emitting light, he/she cannot see the whole image of all the subpixels that correspond to the aperture of the grating, and problems such as color cast will be caused.

BRIEF DESCRIPTION

The embodiments of the present disclosure provide a 3D display panel, a 3D display method and a display device, so as to avoid the decrease of brightness or the occurrence of color cast in the 3D image seen by the user, due to a buffer zone being seen in the OFF state.

According to an embodiment described herein, there is provided a 3D display panel, comprising: a lower substrate, comprising a plurality columns of subpixels in which preset columns of subpixels serve as a buffer zone; a grating, comprising a plurality of aperture areas and a plurality of shielding areas, which are configured to allow images of one part of subpixels in the lower substrate to enter a left eye of a viewer, and allow images of the other part of subpixels in the lower substrate to enter a right eye of the viewer; a positioning unit configured to determine a first distance which the viewer moves, and determine whether or not there is any subpixel of non-buffer zone shielded by the grating according to the first distance; and an adjusting unit configured to adjust the buffer zone when there is any subpixel of non-buffer zone shielded by the grating.

In one embodiment, a buffer zone is disposed at an interval of P columns of subpixels in the lower substrate, and each buffer zone comprises Q columns of subpixels, each aperture area of the grating allows an image with a width of P columns of subpixels in the lower substrate to enter into the viewer's eyes, and each shielding area of the grating shields an image with a width of Q columns of subpixels in the lower substrate, wherein, P and Q are positive integers, and Q≤P≤2Q.

In one embodiment, when there are J columns of subpixels of non-buffer zone shielded by the grating, the adjusting unit is further configured to turn on corresponding J columns of subpixels in the buffer zone at a distance of P columns of subpixels from the J columns of subpixels of non-buffer zone, wherein 1≤J≤Q.

In one embodiment, among a column of subpixels out of the corresponding J columns of subpixels, at a distance of P columns of subpixels from a column where any subpixel out of the J columns of subpixels of non-buffer zone is located, subpixel in the same row as the any subpixel has the same turned-on color as that of the any subpixel.

In one embodiment, the adjusting unit is further configured to determine whether or not the first distance D equals to N*L/(3*n) and N is a positive integer, wherein L indicates a pupillary distance of the viewer, and n indicates a refractive index of a base in an upper substrate corresponding to the lower substrate, if so, the J columns of subpixels of non-buffer zone are determined as being completely shielded and set as a buffer zone.

In one embodiment, the adjusting unit is configured to obtain a remainder N1 of N/(P+Q), and to set subpixels, at a distance of N1 columns of subpixels from a preset column of subpixels in a direction opposite to the moving direction of the viewer, as a buffer zone.

In one embodiment, P=2, Q=1, and each column of subpixels have the same width, wherein a width side of a first subpixel is a/2 away from corresponding width side of a second subpixel adjacent thereto in an adjacent column, "a" indicates a length of subpixel, and the first subpixel and the second subpixel have different colors.

In one embodiment, the length "a" of a subpixel is 4 times a width b of the subpixel.

In one embodiment, a subpixel group with a width 6b and a length a3/2 is taken as a display unit for driving.

According to another embodiment described herein, there is provided a display device, comprising any one of the above 3D display panels.

According to another embodiment described herein, there is provided a 3D display method based on any one of the above 3D display panels, comprising: determining a first distance which a viewer moves, and determining whether or not there is any subpixel of non-buffer zone shielded by a grating according to the first distance; and adjusting the buffer zone when there is any subpixel of non-buffer zone shielded by the grating.

In one embodiment, when there are J columns of subpixels of non-buffer zone shielded by the grating, adjusting the buffer zone comprises: turning on corresponding J columns of subpixels in the buffer zone at a distance of P columns subpixels from the J columns of subpixels of non-buffer zone, wherein 1≤J≤Q.

In one embodiment, among a column of subpixels of the corresponding J columns of subpixels, at a distance of P columns of subpixels from a column where any subpixel out of the J columns of subpixels of non-buffer zone is located, subpixel in the same row as the any subpixel has the same turned-on color as that of the any subpixel.

In one embodiment, adjusting the buffer zone further comprises: determining whether or not the first distance D equals to N*L/(3*n) and N indicates a positive integer, wherein L indicates a pupillary distance of the viewer, and n is a refractive index of a base in an upper substrate corresponding to the lower substrate, if so, the J columns of subpixels of non-buffer zone are determined as being completely shielded and set as a buffer zone.

In one embodiment, adjusting the buffer zone comprises: obtaining a remainder N1 of N/(P+Q), and setting subpixels, at a distance of N1 columns of subpixels from a preset column of subpixels in a direction opposite to the moving direction of the viewer, as a buffer zone.

In the above embodiments, the buffer zone is adjusted according to the area and color of the shielded subpixels, such that the user will not see the buffer zone in the image, which ensures that all subpixels in the image seen by the user are used to display the image, and avoids the decrease of brightness or the occurrence of color error in the image when the buffer zone is seen by the user.

BRIEF DESCRIPTION OF THE DRAWINGS

The characteristics and advantages of the embodiments of the present disclosure will be understood more clearly with reference to the drawings, which are just schematic rather than any limitation to the present disclosure, in which.

DETAILED DESCRIPTION

In order to more clearly understand the embodiments of the present disclosure, the embodiments of the present disclosure will be described in details with reference to the drawings and implementations. To be noted, when there is no conflict, the embodiments of the present disclosure and the features therein may be combined with each other.

The following descriptions will elaborate many details for sufficiently understanding the embodiments of the present disclosure, but the embodiments of the present disclosure may also be implemented in other ways different from those described herein, thus the protection scope of the present disclosure is not limited by the specific embodiments disclosed as follows.

Figure 3:
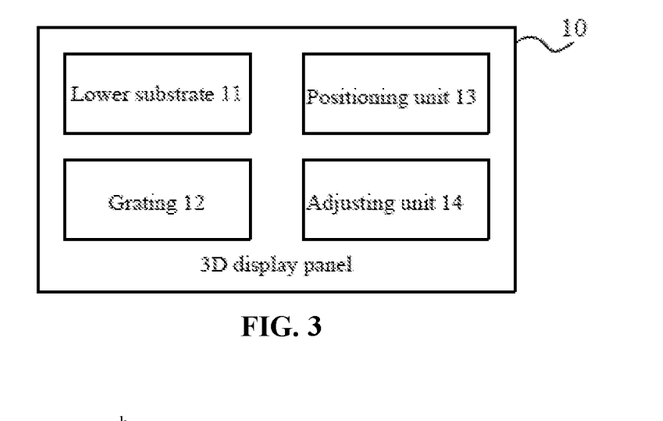
FIG. 3 illustrates a block diagram of a 3D display panel according to an embodiment of the present disclosure.

As illustrated in FIG. 3, a 3D display panel 10 according to an embodiment of the present disclosure comprises: a lower substrate 11 comprising a plurality columns of subpixels in which preset columns of subpixels serve as a buffer zone; a grating 12 comprising a plurality of aperture areas and a plurality of shielding areas, which are configured to allow images of one part of subpixels in the lower substrate to enter a left eye of a viewer, and allow images of the other part of subpixels in the lower substrate to enter a right eye of the viewer; a positioning unit 13 configured to determine a first distance which the viewer moves, and determine whether or not there is any subpixel of non-buffer zone shielded by the grating according to the first distance; and an adjusting unit 14 configured to adjust the buffer zone when there is any subpixel of non-buffer zone shielded by the grating.

In the embodiment of the present disclosure, by adjusting a buffer zone to be ON or OFF, light emitted from the subpixels shielded by the grating can be compensated by turning on the subpixels in a column where the buffer zone is located, such that the user will not see the buffer zone in the image either in the moving state or in the static state, which ensures that all subpixels in the image viewed by the user are used to display the image, and avoids the decrease of brightness or the occurrence of color cast in the viewed image due to the buffer zone being seen by the user.

To be noted, the 3D display panel in the embodiment of the present disclosure may further comprise an upper substrate. Further, when the embodiment of the present disclosure is used for liquid crystal displaying, the 3D display panel may also comprise a liquid crystal layer, and in this case, the lower substrate is an array substrate, and the upper substrate is a color film substrate. When the embodiment of the present disclosure is used for organic light emitting diode displaying, the 3D display panel may further comprise conventional structures for displaying, such as an organic light emitting layer, which will not be described in detail herein.

In one embodiment, a buffer zone is disposed at an interval of P columns of subpixels in the lower substrate, and each buffer zone comprises Q columns of subpixels; each aperture area of the grating allows an image with a width of P columns of subpixels in the lower substrate to enter into the viewer's eyes, and each shielding area of the grating shields an image with a width of Q columns of subpixels in the lower substrate, where, P and Q are positive integers, and Q≤P≤2Q.

By disposing the lower substrate and grating according to this embodiment, Q columns of subpixels in the substrate are shielded by the grating at an interval of P columns of subpixels so as to serve as a buffer zone, which facilitates the setting of the buffer zone.

In one embodiment, when J columns of subpixels of non-buffer zone are shielded by the grating, the adjusting unit is further configured to turn on corresponding J columns of subpixels in the buffer zone at a distance of P columns subpixels from the J columns of subpixels of non-buffer zone, where 1≤J≤Q.

By turning on the J columns of subpixels in the buffer zone which are corresponding to a same aperture area with the shielded J columns of subpixels, the image displayed by the shielded J columns of subpixels can be compensated for, which ensure the brightness of the displayed image.

For example, in a case of 12 columns of subpixels where the $3^{rd}$ to $6^{th}$ and the $9^{th}$ to $12^{th}$ columns of subpixels emit light (i.e., P=4), and the $1^{st}$, $2^{nd}$, $7^{th}$ and $8^{th}$ columns of subpixels serves as a buffer zone (i.e., Q=2), when the user moves such that the $3^{rd}$ and $4^{th}$ columns of subpixels are shielded (i.e., J=2), the $3^{rd}+4^{th}=7^{th}$ and the $4^{th}+4^{th}=8^{th}$ columns of subpixels are turned on, so as to compensate for the images displayed by the $3^{rd}$ and $4^{th}$ columns of subpixels through the images displayed by the $7^{th}$ and $8^{th}$ columns of subpixels.

In one embodiment, among a column of subpixels of the corresponding J columns of subpixels, at a distance of P columns of subpixels from a column where any subpixel out of the J columns of subpixels of non-buffer zone is located, subpixel in the same row as the any subpixel has the same turned-on color as that of the any subpixel.

According to the above embodiment, for example, red light is emitted when the $3^{rd}$ column of subpixels are turned on, and green light is emitted when the $4^{th}$ column of subpixels are turned on, then it may be set that red light is emitted when the $7^{th}$ column of subpixels are turned on, and green light is emitted when the $8^{th}$ column of subpixels are turned on, such that the colors of light emitted from the shielded subpixels are compensated for, and that the colors displayed by the shielded J columns of subpixels can be presented completely. Specifically, a color resistant layer on the upper substrate corresponding to the $7^{th}$ column of subpixels may be red, and a color resistant layer on the upper substrate corresponding to the $8^{th}$ column of subpixels may be green.

In one embodiment, the adjusting unit is further configured to determine whether or not the first distance D equals to $N*L/(3*n)$ and N is a positive integer, wherein L indicates a pupillary distance of the viewer, and n indicates a refractive index of a base in an upper substrate corresponding to the lower substrate. If so, the J columns of subpixels of non-buffer zone are determined as being completely shielded and set as a buffer zone. In the embodiment of the present disclosure, the proportion relation between a distance S from the viewer to the grating and a distance h from the grating to the lower substrate is usually fixed. For example, with respect to a 3D display device with adjustable h, h may be adjusted according to S, and with respect to a 3D display device with unadjustable h, the viewer may be prompted to move to a position with a distance S from the grating for viewing (the grating is usually disposed above the upper substrate, and may be approximately taken as a screen surface).

Under the condition that the proportion relation between S and h is fixed, according to the geometrical relation, a relation between the distance D for which the viewer moves and the distance d for which the buffer zone moves is:

$$D=d*L/(3*b*n),$$

where b indicates the width of each column of pixels. It is assumed that Q columns of subpixels in the buffer zone are shielded by the grating when the user initially sees the images, then the positions of the pixel columns shielded by the grating change with the movement of the viewer. The movement of the buffer zone in this embodiment means that after the movement, images of the subpixels in the buffer zone are displayed, while the shielded subpixels of non-buffer zone are taken as the buffer zone.

As can be derived from the above equation, when D equals to $N*L/(3*n)$, d equals to $N*b$, and since N is a positive integer, i.e., the buffer zone moves for N pixels, the buffer zone after moved includes Q columns of subpixels completely.

In order to prove the above relation, it may be assumed that the columns of subpixels of non-buffer zone are not completely shielded, the number of columns of pixels in the lower substrate entering into the eyes of the viewer through the aperture area is certainly not an integer, i.e., not P, which obviously does not meet the structure of the grating. Thus under the condition that D equals to $N*L/(3*n)$ and N is a positive integer, the columns of subpixels of non-buffer zone are certainly shielded completely.

Similarly, when the above relation is untenable, e.g., N is not a positive integer, the subpixels of non-buffer zone will not be shielded completely.

According to the above embodiment, if the $3^{rd}$ and $4^{th}$ columns of subpixels are shielded completely, those two columns of subpixels are set as the buffer zone, and the $7^{th}$ and $8^{th}$ columns of subpixels are turned on.

In one embodiment, the adjusting unit is configured to obtain a remainder N1 of N/(P+Q), and to set subpixels, at a distance of N1 columns of subpixels from a preset column of subpixels in a direction opposite to the moving direction of the viewer, as a buffer zone.

According to the above embodiment, N=2, P+Q=6, and a remainder of 2/6 is 2, thus the $9^{th}$ and $10^{th}$ columns of subpixels at a distance of 2 columns of subpixels from the $7^{th}$ and $8^{th}$ columns of subpixels serve as a buffer zone. According to the setting, the $3^{rd}$ and $4^{th}$ columns of subpixels at a distance of 2 columns of subpixels from the $1^{st}$ and $2^{nd}$ columns of subpixels serve as a buffer zone. Actually, the $3^{rd}$ and $4^{th}$ columns of subpixels are completely shielded, thus the adjusted buffer zones are those columns of subpixels which are completely shielded, thereby ensuring that the total number of pixels which emit light incident to the user's eyes through the grating aperture area is unchanged.

Figure 4:
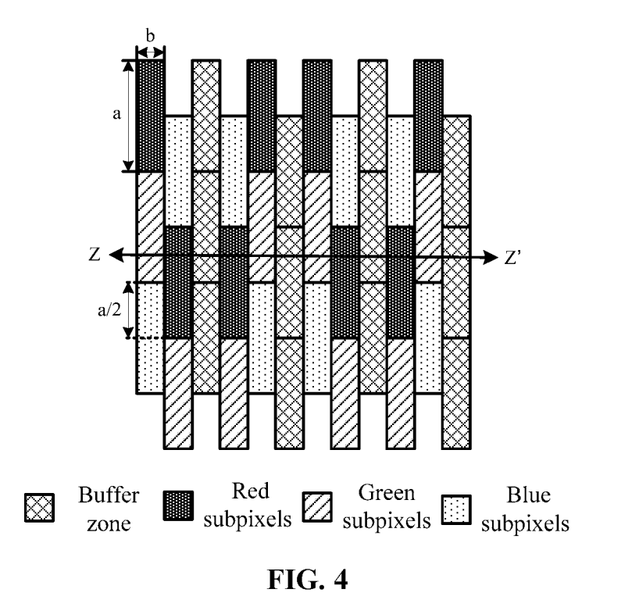
FIG. 4 illustrates a schematic structure diagram of a lower substrate according to an embodiment of the present disclosure.

As illustrated in FIG. 4, in one embodiment, P=2, Q=1, and each column of subpixels have the same width, in which, a width side of a first subpixel is a/2 away from corresponding width side of a second subpixel adjacent thereto in an adjacent column, where "a" indicates a length of a subpixel. For example in FIG. 4, an upper width side of a blue subpixel in the first column is a/2 away from an upper width side of a green subpixel in the second column, and the first subpixel and the second subpixel have different colors.

When a pixel includes red, green and blue subpixels, the pixel may be arranged according to this embodiment such that, taking any two consecutive subpixels in a column and a third subpixel in an adjacent column and centered with respect to the any two consecutive subpixels, the resulting three subpixels include one each of red, green and blue subpixels, thereby ensuring a good borrowing between adjacent pixels during displaying, and achieving a favorable display effect.

Figure 5:
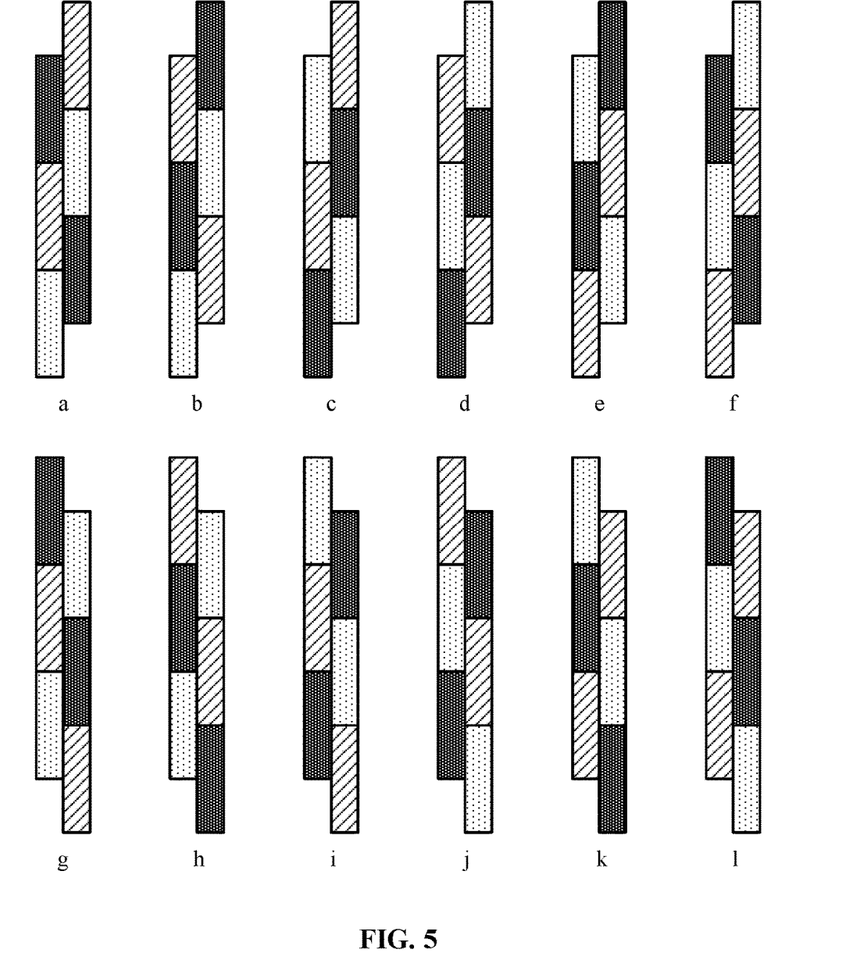
FIG. 5 illustrates a schematic diagram of subpixel arrangements according to an embodiment of the present disclosure.

To be noted, the subpixel arrangement as illustrated in FIG. 4 is just one embodiment of the present disclosure, and when a pixel includes red, green and blue subpixels, the pixels arrangements for adjacent columns in the present disclosure may also be designed in any other suitable fashion, for example as illustrated in several embodiments in FIG. 5, which will not be described in detail herein.

In this embodiment, it can be understood that the subpixels may be arranged on the screen either orderly and horizontally in a column way, or orderly and vertically in a row way. Specifically, for example, in a rectangular screen, the subpixels may be arranged, such that the width sides of the subpixels are parallel with that of the screen. Of course, upon demand, it may be arranged that the width sides of the subpixel are parallel with the length side of the screen, in this case, the pixel arrangement is shown in FIG. 4 when the screen is laterally placed.

In one embodiment, a length "a" of a subpixel is 4 times a width b of the subpixel.

Figure 6:
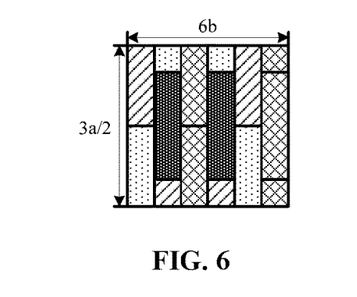
FIG. 6 illustrates a schematic diagram of a display unit according to an embodiment of the present disclosure.

In an optional embodiment, a subpixel group with a width 6b and a length a3/2 (as illustrated in FIG. 6) is taken as a display unit for driving.

By arranging the subpixels according to this embodiment, it can be ensured that the subpixel group taken as a display unit for driving have its length equal to the width, i.e., 3a/2=6b, such that it is more convenient to arrange the columns of subpixels based on the display unit, and the space in the panel can be utilized more sufficiently.

Next, the setting or adjustment of the buffer zone in the present disclosure may be described with reference to FIGS. 7 to 10 through an embodiment in which P=2 and Q=1, wherein the lower substrate 11 illustrated in FIGS. 7 to 10 is a cross-section of the lower substrate illustrated in FIG. 4 along ZZ'.

Figure 7:
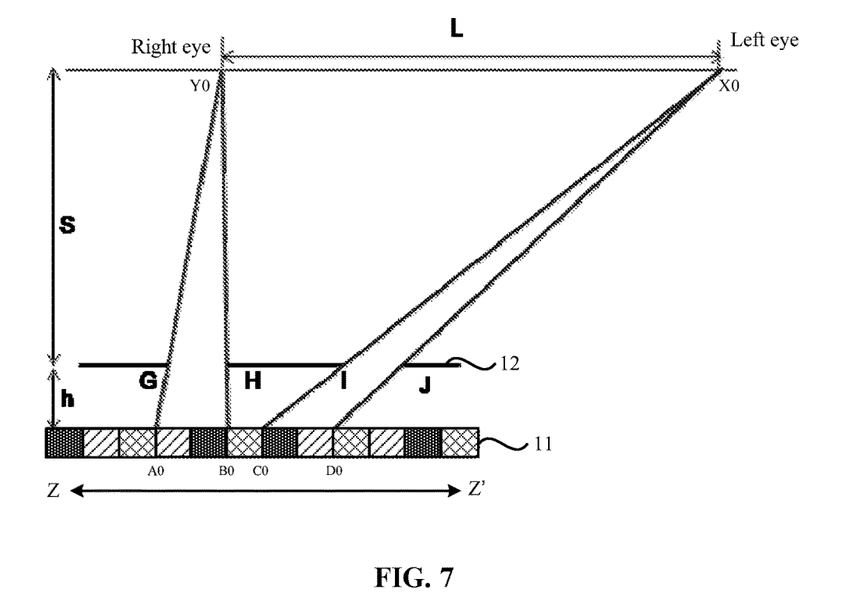
FIG. 7 illustrates a schematic diagram of the adjustment of buffer zone according to an embodiment of the present disclosure.

As illustrated in FIG. 7, an initial position of the user's left eye is X0, an initial position of the right eye is Y0, a distance between the left and right eyes is L, a distance from the user to the grating 12 is S, a distance from the grating 12 to the lower substrate 11 is h, and an aperture ratio of the grating 12 is ⅓. At the initial position, the left eye of the user may see the columns of subpixels from C0 to D0, the right eye may see the columns of subpixels from A0 to B0, and one column of subpixels between B0 and C0 serves as a buffer zone.

Figure 8:
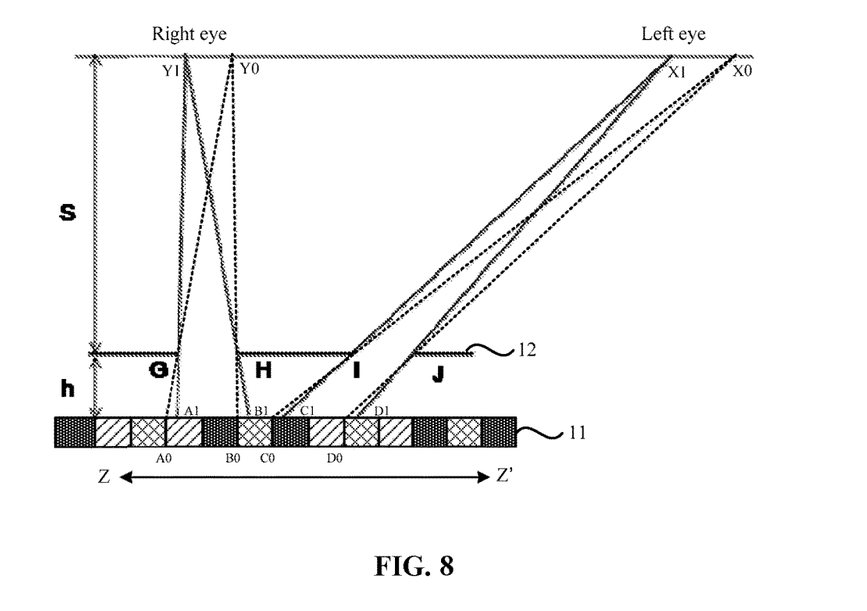
FIG. 8 illustrates another schematic diagram of the adjustment of buffer zone according to an embodiment of the present disclosure.

As illustrated in FIG. 8, when the user moves rightwards, the position of the left eye becomes X1, and the position of the right eye becomes Y1. At this position, the columns of subpixels seen by the user are changed and moved in a direction opposite to the user's moving direction, i.e., the right eye may see the columns of subpixels from A1 to B1, and the left eye may see the columns of subpixels from C1 to D1. Specifically, the green subpixels at A1 and the red subpixels at C1 are partially shielded. For example, the $4^{th}$ column of subpixels are at A1, and the $7^{th}$ column of subpixels are at C1, thus the $4^{th}+2^{nd}=6^{th}$ and the $7^{th}+2^{nd}=9^{th}$ columns of subpixels may be turned on, i.e., the buffer zones at B1 and D1 are turned on (buffer zones at other corresponding positions are turned on at the same time), wherein the buffer zone at B1 and the column of subpixels at A1 are corresponding to the same aperture area, and the buffer zone at D1 and the column of subpixels at C1 are corresponding to the same aperture area. The brightness of the image seen by the user's right eye may be ensured by turning on the buffer zone at B1, and the brightness of the image seen by the user's left eye may be ensured by turning on the buffer zone at D1, so as to compensate for the image displayed by the shielded columns of subpixels at A1 and C1, such that the user will not see the columns of subpixels turned off, and the brightness of the viewed image can be ensured.

Further, it may be set that the turned-on color of the subpixels at B1 is the same as that of the subpixels at A1, and the turned-on color of the subpixels at D1 is the same as that of the subpixels at C1 (the color of subpixels in a buffer zone at other corresponding position may also be set at the same time), such that the color of the subpixels shielded by the grating 12 can be compensated for, and the color displayed by the shielded subpixels can be presented completely to avoid a color cast.

Figure 9:
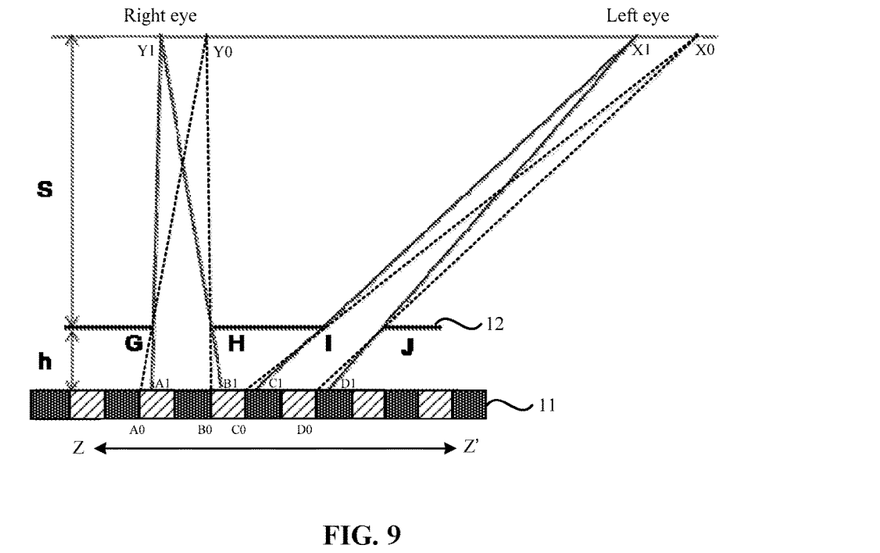
FIG. 9 illustrates another schematic diagram of the adjustment of buffer zone according to an embodiment of the present disclosure.

The adjusted buffer zones are illustrated in FIG. 9. When the buffer zone at B1 is turned on, the subpixels at the same row as the green subpixels at A1 are also displayed as green, and when the buffer zone at D1 is turned on, the subpixels at the same row as the red subpixels at C1 are also displayed as red.

Figure 10:
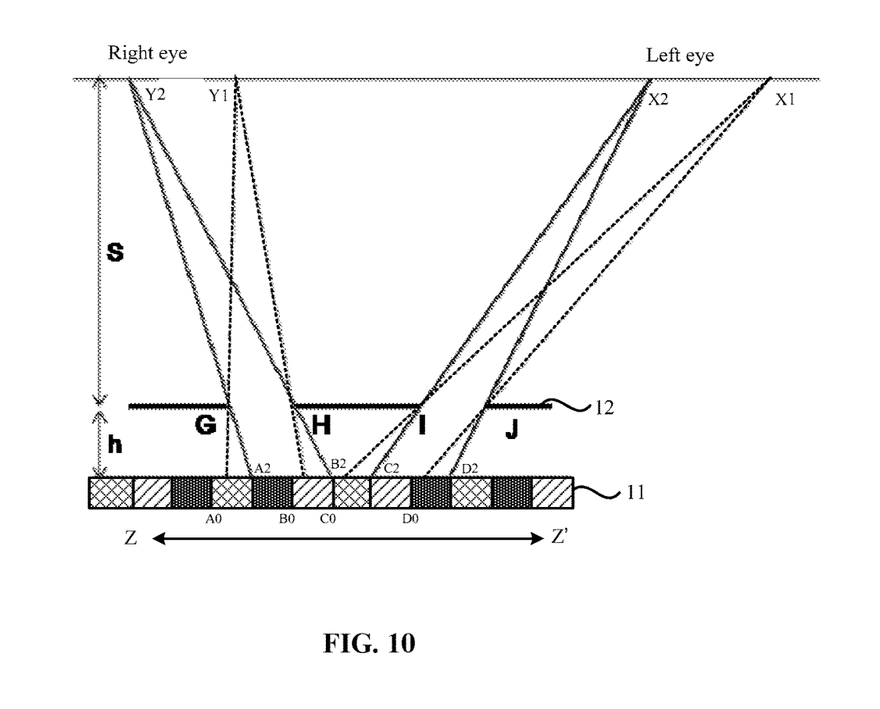
FIG. 10 illustrates another schematic diagram of the adjustment of buffer zone according to an embodiment of the present disclosure.

As illustrated in FIG. 10, when the user continues moving rightwards, the position of the left eye becomes X2, and the position of the right eye becomes Y2. At this position, the columns of subpixels seen by the user are changed and moved in a direction opposite to the user's moving direction, i.e., the right eye may sew the columns of subpixels from A2 to B2, and the left eye may see the columns of subpixels from C2 to D2. The column of subpixels between A0 and B0 where the green subpixels are originally located are fully shielded, and the column of subpixels between C0 and D0 where the red subpixels are originally located are fully shielded. In this case, d=1*b, and the two columns of subpixels are set as buffer zones (i.e., one column of subpixels at the right side of the original buffer zone is set as a buffer zone); the buffer zone between B0 and B2 is turned on such that the subpixels in the same row as the green subpixels at A1 are also displayed as green, and the buffer zone between D0 and D2 is turned on such that the subpixels in the same row as the red subpixels at C1 are also displayed as red, thereby achieving the adjustment of buffer zones.

To be noted, in the embodiment of the present disclosure, the column of subpixels corresponding to the buffer zone before and after the adjustment may be in either an ON state or an OFF state when they are completely shielded. Generally, in order to save electric energy, the columns of subpixels used as the buffer zone are in an OFF state.

The present disclosure further provides a display device, comprising the 3D display panel.

To be noted, the display device in this embodiment may be any product or part having a display function, such as an electronic paper, a cell phone, a tablet computer, a television, a notebook computer, a digital photo frame, and a navigator.

Figure 11:
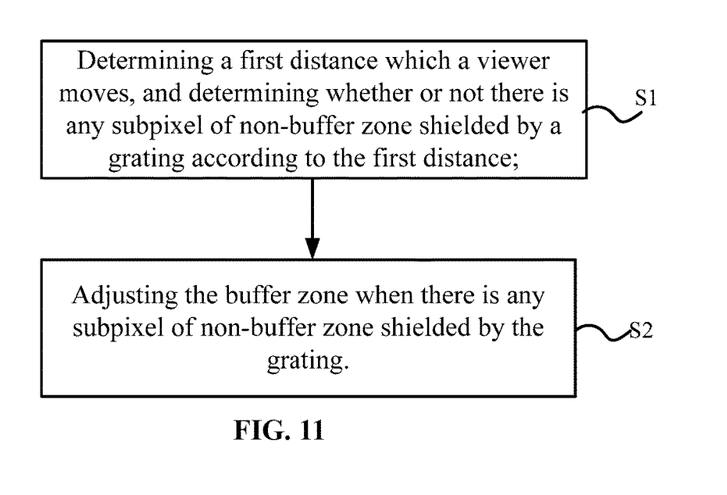
FIG. 11 illustrates a schematic flow diagram of a 3D display method according to an embodiment of the present disclosure.

As illustrated in FIG. 11, the present disclosure further provides a 3D display method based on the 3D display panel. The method comprises:

S1: determining a first distance which a viewer moves, and determining whether or not there is any subpixel of non-buffer zone shielded by a grating according to the first distance; and S2: adjusting the buffer zone when there is any subpixel of non-buffer zone shielded by the grating.

In one embodiment, when there are J columns of subpixels of non-buffer zone shielded by the grating, adjusting the buffer zone comprises: turning on corresponding J columns of subpixels in the buffer zone at a distance of P columns of subpixels from the J columns of subpixels of non-buffer zone, where 1≤J≤Q.

In one embodiment, among a column of subpixels of the corresponding J columns of subpixels, at a distance of P columns of subpixels from a column where any subpixel out of the J columns of subpixels of non-buffer zone is located, subpixel in the same row as the any subpixel has the same turned-on color as that of the any subpixel.

In one embodiment, adjusting the buffer zone comprises: determining whether or not the first distance D equals to N*L/(3*n) and N is a positive integer, where L is a pupillary distance of the viewer, and n indicates a refractive index of a base in an upper substrate corresponding to the lower substrate, if so, the J columns of subpixels of non-buffer zone are determined as being completely shielded and set as a buffer zone.

In one embodiment, adjusting the buffer zone comprises: obtaining a remainder N1 of N/(P+Q), and setting subpixels, at a distance of N1 columns of subpixels from a preset column of subpixels in a direction opposite to the moving direction of the viewer, as a buffer zone.

The present disclosure is described as above in details with reference to the drawings. In the present disclosure, when the user moves to a particular angle or position, the buffer zone is adjusted (e.g., turned on or off) according to the area and color of the shielded subpixels, such that the user will not see a buffer zone not turned on in the image, which ensures that all subpixels viewed by the user are used to display the image, and avoids the decrease of brightness or the occurrence of color cast in the viewed image when the user sees a buffer zone not turned on.

In the descriptions of the present disclosure, the terms 'first' and 'second' are only used for the purpose of description, rather than indicating or implying any relative importance. Unless otherwise specified, 'a plurality of' means two or more. Orientations or positional relationships indicated by the terms 'on', 'under', 'top', 'bottom', 'left', 'right', etc. are based on those illustrated in the drawings, just for facilitating the descriptions of the present disclosure and simplifying the descriptions, rather than specifying or implying that the concerned devices or elements must have particular orientations, or configured and operated in particular orientations, and hence cannot be understood as limitations to the present disclosure.

The above descriptions are just preferred embodiments of the present disclosure, rather than limitations thereto. As known to a person skilled in the art, various modifications and changes may be made to the present disclosure. Any modification, equivalent replacement, improvement, etc. made under the spirit and principle of the present disclosure shall be covered by the protection scope of the present disclosure.

What is claimed is:

1. A 3D display panel, comprising:
    a lower substrate, comprising a plurality columns of subpixels in which preset columns of subpixels serve as a buffer zone; and
    a grating, comprising a plurality of aperture areas and a plurality of shielding areas, which are configured to allow images of one part of subpixels in the lower substrate to enter a left eye of a viewer, and allow images of the other part of subpixels in the lower substrate to enter a right eye of the viewer;
    wherein the 3D display panel is configured to determine a first distance which the viewer moves, and determine whether any subpixel of non-buffer zone is shielded by the grating according to the first distance;
    wherein the 3D display panel is configured to adjust the buffer zone when the any subpixel of non-buffer zone is shielded by the grating,
    wherein the buffer zone is disposed at an interval of P columns of subpixels in the lower substrate, and each buffer zone comprises Q columns of subpixels,
    wherein each aperture area of the grating allows an image with a width of P columns of subpixels in the lower substrate to enter into the viewer's eyes, and each shielding area of the grating shields an image with a width of Q columns of subpixels in the lower substrate, wherein P and Q are positive integers, and Q≤P≤2Q, and
    wherein in response to determining that J columns of subpixels of non-buffer zone are shielded by the grating, the 3D display panel is further configured to turn on a corresponding J columns of subpixels in the buffer zone at a distance of P columns of subpixels from the J columns of subpixels of non-buffer zone, wherein 1≤J≤Q.

2. The 3D display panel according to claim 1, wherein among a column of subpixels out of the corresponding J columns of subpixels, at a distance of P columns of subpixels from a column where any subpixel out of the J columns of subpixels of non-buffer zone is located, a subpixel of the column of subpixels out of the corresponding J columns in the same row as the any subpixel has the same turned-on color as that of the any subpixel.

3. The 3D display panel according to claim 2, wherein the 3D display panel is further configured to determine whether the first distance D equals to N*L/(3*n), wherein N is a positive integer, wherein L indicates a pupillary distance of the viewer, and n indicates a refractive index of a base in an upper substrate corresponding to the lower substrate, and
    to determine that the J columns of subpixels of non-buffer zone are completely shielded in response to the first distance D being equal to N*L/(3*n), and to set the J columns of completely shielded subpixels as a buffer zone.

4. The 3D display panel according to claim 3, wherein the 3D display panel is configured to obtain a remainder N1 of N/(P+Q), and to set subpixels, at a distance of N1 columns of subpixels from a preset column of subpixels in a direction opposite to the moving direction of the viewer, as a buffer zone.

5. The 3D display panel according to claim 1, wherein P=2, Q=1, and each column of subpixels have the same width,
    wherein a width side of a first subpixel is a/2 away from corresponding width side of a second subpixel adjacent thereto in an adjacent column, wherein "a" indicates a length of a subpixel, and the first subpixel and the second subpixel have different colors.

6. The 3D display panel according to claim 5, wherein the length "a" of a subpixel is 4 times a width b of the subpixel.

7. The 3D display panel according to claim 6, wherein a subpixel group with a width 6b and a length 3a/2 is taken as a display unit for driving.

8. A display device comprising a 3D display panel, the 3D display panel comprising:
    a lower substrate, comprising a plurality columns of subpixels in which preset columns of subpixels serve as a buffer zone; and
    a grating, comprising a plurality of aperture areas and a plurality of shielding areas, which are configured to allow images of one part of subpixels in the lower substrate to enter a left eye of a viewer, and allow images of the other part of subpixels in the lower substrate to enter a right eye of the viewer;
    wherein the 3D display panel is configured to determine a first distance which the viewer moves, and determine whether any subpixel of non-buffer zone is shielded by the grating according to the first distance;
    wherein the 3D display panel is configured to adjust the buffer zone when the any subpixel of non-buffer zone is shielded by the grating,
    wherein the buffer zone is disposed at an interval of P columns of subpixels in the lower substrate, and each buffer zone comprises Q columns of subpixels,
    wherein each aperture area of the grating allows an image with a width of P columns of subpixels in the lower substrate to enter into the viewer's eyes, and each shielding area of the grating shields an image with a width of Q columns of subpixels in the lower substrate, wherein P and Q are positive integers, and Q≤P≤2Q, and wherein in response to determining that J columns of subpixels of non-buffer zone are shielded by the grating, the 3D display panel is further configured to turn on a corresponding J columns of subpixels in the buffer zone at a distance of P columns of subpixels from the J columns of subpixels of non-buffer zone, wherein 1≤J≤Q.

9. The 3D display device according to claim 8, wherein among a column of subpixels out of the corresponding J columns of subpixels, at a distance of P columns of subpixels from a column where any subpixel out of the J columns of subpixels of non-buffer zone is located, a subpixel of the column of subpixels out of the corresponding J columns in the same row as the any subpixel has the same turned-on color as that of the any subpixel.

10. The 3D display device according to claim 9, wherein the 3D display panel is further configured to determine whether the first distance D equals to N*L(3*n), wherein N is a positive integer, wherein L indicates a pupillary distance of the viewer, and n indicates a refractive index of a base in an upper substrate corresponding to the lower substrate, and wherein the 3D display panel is further configured to determine that the J columns of subpixels of non-buffer zone are completely shielded in response to the first distance D being equal to N*L/(3*n), and to set the J columns of completely shielded subpixels as a buffer zone.

11. The 3D display device according to claim 10, wherein the 3D display panel is configured to obtain a reminder N1 of N/(P+Q), and to set subpixels, at a distance of N1 columns of subpixels from a preset column of subpixels in a direction opposite to the moving direction of the viewer, as a buffer zone.

12. A method for 3D display on a 3D display panel, the panel including a lower substrate comprising a plurality columns of subpixels in which preset columns of subpixels serve as a buffer zone, and a grating including a plurality of aperture areas and a plurality of shielding areas which are configured to allow images of one part of subpixels in the lower substrate to enter a left eye of a viewer and allow images of the other part of subpixels in the lower substrate to enter a right eye of the viewer, wherein the 3D display panel is configured to determine a first distance which the viewer moves and determine whether any subpixel of non-buffer zone is shielded by the grating according to the first distance, wherein the 3D display panel is configured to adjust the buffer zone when the any subpixel of non-buffer zone is shielded by the grating, wherein a buffer zone is disposed at an interval of P columns of subpixels in the lower substrate, and each buffer zone comprises Q columns of subpixels, wherein each aperture area of the grating allows an image with a width of P columns of subpixels in the lower substrate to enter into the viewer's eyes, and each shielding area of the grating shields an image with a width of Q columns of subpixels in the lower substrate, and wherein P and Q are positive integers, and Q≤P≤2Q, the method comprising:

determining a first distance which a viewer moves, and determining whether any subpixel of non-buffer zone is shielded by a grating according to the first distance; and adjusting the buffer zone when the any subpixel of non-buffer zone is shielded by the grating, wherein when there are J columns of subpixels of non-buffer zone shielded by the grating, adjusting the buffer zone comprises turning on a corresponding J columns of subpixels in the buffer zone at a distance of P columns of subpixels from the J columns of subpixels of non-buffer zone, wherein 1≤J≤Q.

13. The method according to claim 12, wherein among a column of subpixels of the corresponding J columns of subpixels, at a distance of P columns of subpixels from a column where any subpixel out of the J columns of subpixels of non-buffer zone is located, a subpixel of the column of subpixels of the corresponding columns in the same row as the any subpixel has the same turned-on color as that of the any subpixel.

14. The method according to claim 13, wherein adjusting the buffer zone further comprises:

determining whether the first distance D equals to N*L/(3*n), wherein N is a positive integer, wherein L indicates a pupillary distance of the viewer, and n indicates a refractive index of a base in an upper substrate corresponding to the lower substrate, to determine that the J columns of subpixels of non-buffer zone are completely shielded in response to the first distance D being equal to N*L(3*n), and to set the J columns of completely shielded subpixels as a buffer zone.

15. The method according to claim 14, wherein adjusting the buffer zone comprises:

obtaining a remainder N1 of N/(P+Q), and setting subpixels, at a distance of N1 columns of subpixels from a preset column of subpixels in a direction opposite to the moving direction of the viewer, as a buffer zone.

* * * * *

UNITED STATES PATENT AND TRADEMARK OFFICE
CERTIFICATE OF CORRECTION

PATENT NO. : 10,306,204 B2
APPLICATION NO. : 15/113662
DATED : May 28, 2019
INVENTOR(S) : Ming Yang et al.

Page 1 of 1

It is certified that error appears in the above-identified patent and that said Letters Patent is hereby corrected as shown below:

In the Claims

In Claim 10, Column 11, Line 19, delete "N*L(3*n), wherein" and insert therefor -- N*L/(3*n), wherein --.
In Claim 14, Column 12, Line 39, delete "N*L(3*n), and" and insert therefor -- N*L/(3*n), and --.

Signed and Sealed this
Twenty-seventh Day of August, 2019

Andrei Iancu
*Director of the United States Patent and Trademark Office*